(12) United States Patent
Bellotti et al.

(10) Patent No.: US 11,797,039 B2
(45) Date of Patent: Oct. 24, 2023

(54) NON-VOLATILE MEMORY DEVICE

(71) Applicant: SK hynix Inc., Gyeonggi-do (KR)

(72) Inventors: Giovanni Bellotti, Agrate Brianza (IT); Marco Passerini, Agrate Brianza (IT)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/733,177

(22) Filed: Apr. 29, 2022

(65) Prior Publication Data
US 2023/0176601 A1 Jun. 8, 2023

(30) Foreign Application Priority Data

Dec. 3, 2021 (IT) ........................ 102021000030611

(51) Int. Cl.
*G05F 1/575* (2006.01)
*G05F 1/46* (2006.01)

(52) U.S. Cl.
CPC .............. *G05F 1/575* (2013.01); *G05F 1/461* (2013.01); *G05F 1/468* (2013.01)

(58) Field of Classification Search
CPC ........... G05F 1/575; G05F 1/461; G05F 1/468
See application file for complete search history.

(56) References Cited

U.S. PATENT DOCUMENTS

| | | | |
|---|---|---|---|
| 7,218,168 B1* | 5/2007 | Rahman ..................... | G05F 1/56 327/540 |
| 10,768,650 B1 | 9/2020 | Huang | |
| 10,915,133 B1* | 2/2021 | Zhang ................ | G11C 13/0028 |
| 2010/0074034 A1* | 3/2010 | Cazzaniga ............. | G11C 16/30 323/275 |

(Continued)

FOREIGN PATENT DOCUMENTS

KR 10-0739256 B1 7/2007
KR 10-2009-0101739 A 9/2009
(Continued)

OTHER PUBLICATIONS

Search Report for Italian Patent Application No. 102021000030611 issued by the European Patent Office dated Jul. 20, 2022.
(Continued)

*Primary Examiner* — Jue Zhang
*Assistant Examiner* — Lakaisha Jackson
(74) *Attorney, Agent, or Firm* — IP & T GROUP LLP

(57) ABSTRACT

A non-volatile memory device comprises memory cells, a first regulator, a second regulator, a first switch, a second switch and capacitor coupling switches. The first regulator comprises a first capacitor, and generates a first voltage at a first node connected to a first subset of the memory cells, to provide the first voltage to the first subset. The second regulator comprises a second capacitor, and generates a second voltage at a second node. The first switch selectively couples the second node to a second subset of the memory cells, to provide the second voltage to the second subset. The second switch selectively couples the first node to the second subset to also provide the first voltage to the second subset. The capacitor coupling switches selectively couple the second capacitor in parallel to the first capacitor when the first switch is deactivated, and the second switch is activated.

15 Claims, 5 Drawing Sheets

(56) References Cited

U.S. PATENT DOCUMENTS

| | | | |
|---|---|---|---|
| 2013/0151871 A1* | 6/2013 | Huynh | G06F 1/26 |
| | | | 713/300 |
| 2015/0009763 A1 | 1/2015 | Kumazaki et al. | |
| 2016/0173066 A1 | 6/2016 | Yang et al. | |
| 2017/0053702 A1 | 2/2017 | Caracciolo | |

FOREIGN PATENT DOCUMENTS

| | | |
|---|---|---|
| KR | 10-2019-0017514 A | 2/2019 |
| KR | 10-2021-0083065 A | 7/2021 |

OTHER PUBLICATIONS

Noboru Shibata et al., A 1.33-Tb 4-Bit/Cell 3-D Flash Memory on a 96-Word-Line-Layer Technology, IEEE Journal of Solid-State Circuits, Jan. 2020, p. 178-188, vol. 55, No. 1, IEEE.

* cited by examiner

NON-VOLATILE MEMORY DEVICE

CROSS-REFERENCE TO RELATED APPLICATION

The present application claims priority under 35 U.S.C. § 119(a) to Italian patent application number 102021000030611 filed on Dec. 3, 2021, the entire disclosure of which is incorporated by reference herein.

FIELD OF THE INVENTION

Embodiments of the present invention generally relate to the field of non-volatile semiconductor devices, such as NAND flash memory devices. Particularly, embodiments of the present invention relate to voltage regulators for non-volatile semiconductor devices.

BACKGROUND OF THE INVENTION

Non-volatile memory devices are electronic memory devices capable of retaining stored data even after the power supply is removed. Among the currently available types of non-volatile memory devices, NAND flash memory devices are used as a high-capacity data storage media.

The memory cells of a NAND flash memory device need to be biased with proper voltages, whose levels can vary in a wide range, depending on the operation the memory cells are subjected to. For example, in order to program a memory cell, the memory cell needs to be biased with voltages having sufficiently high values to cause electrons to be trapped in the floating gate of the memory cell. Moreover, different voltage values are required to carry out read operations and erase operations.

The voltages required for the correct operation of the NAND flash memory device are provided by means of one or more voltage regulators. As known to those skilled in the art, a voltage regulator is configured to output a voltage that is regulated to remain essentially constant at a preset value regardless of changes in load conditions.

Since the voltages to be provided to the memory cells of a NAND flash memory device have values that can be higher than the supply voltage of the NAND flash memory device itself, the one or more voltage regulators of the NAND flash memory device are configured to output regulated voltages higher than said supply voltage.

So-called linear voltage regulators are known, which are configured to output a regulated voltage from an input voltage by having a resistance that varies according to the load. A linear voltage regulator operates as a variable resistor, continuously varying a divider ratio of a feedback voltage divider network (e.g., a selectively variable resistor ladder) to maintain a constant regulated voltage.

On the one hand, the regulated voltage outputted by a linear voltage regulator is lower than its input voltage. On the other side, the voltages to be provided to the memory cells have values that can be higher than the supply voltage of the NAND flash memory device. Therefore, the input voltage of the linear voltage regulator also needs to be higher than the supply voltage of the NAND flash memory device. Usually, this input voltage is a charge pump voltage generated by a corresponding charge pump of the NAND flash memory device.

FIG. 1 illustrates an example of a linear voltage regulator, identified with reference 100 that can be used for generating regulated voltages for biasing memory cells of a NAND flash memory device. The linear voltage regulator 100 is based on one of the circuit architectures included in the Italian patent application No. 102021000002618 which is incorporated herein by reference in its entirety.

The linear voltage regulator 100 comprises a first stage including an operational amplifier 105 supplied between a terminal providing a supply voltage Vcc of the NAND flash memory device and a terminal providing a ground voltage GND. The operational amplifier 105 has a positive input terminal configured to receive a feedback voltage Vfb, a negative input terminal configured to receive a reference voltage Vref, a positive output terminal configured to generate an output voltage Vop, and a negative output terminal configured to generate an output voltage Von.

The operational amplifier 105 comprises low voltage MOS transistors. By "low voltage transistor" it is herein meant a transistor manufactured in such a way to be capable of sustaining, between pairs of terminals thereof, voltage differences lower than a predetermined voltage, for example depending on the supply voltage Vcc, such as for example voltage differences lower than 4 Volts.

The linear voltage regulator 100 further comprises a second stage configured to generate a control voltage Vc based on the output voltages Vop, Von generated by the operational amplifier 105, and therefore based on the difference between the reference voltage Vref and the feedback voltage Vfb.

The second stage is supplied between a terminal providing an input voltage Vp—a charge pump voltage generated by a charge pump (not illustrated) of the NAND flash memory device—and a terminal providing the ground voltage GND. The second stage comprises an input sub-stage 110 coupled to a current mirror sub-stage 112 through a cascode sub-stage 114.

The input substage 110 comprises a NMOS transistor 116 having a source terminal coupled to a terminal providing the ground voltage GND, a gate terminal coupled to the positive output of the operational amplifier 105 to receive the output voltage Vop, and a drain terminal coupled to the cascode sub-stage 114. The input substage 110 further comprises a NMOS transistor 118 having a source terminal coupled the source terminal of the transistor 116, a gate terminal coupled to the negative output of the operational amplifier 105 to receive the output voltage Von, and a drain terminal coupled to the cascode sub-stage 114.

The cascode substage 114 comprises a NMOS transistor 120 having a source terminal coupled to the drain terminal of the transistor 116, a gate terminal coupled to a terminal providing a bias voltage Vb, and a drain terminal coupled to the current mirror sub-stage 112. The cascode substage 114 further comprises a NMOS transistor 122 having a source terminal coupled to the drain terminal of the transistor 118, a gate terminal coupled to the gate terminal of the transistor 120, and a drain terminal coupled to the current mirror sub-stage 112.

The current mirror sub-stage 112 comprises two PMOS transistors 124, 126. The transistor 124 has a drain terminal coupled to the drain terminal of the transistor 120 to form a circuit node NO to provide the control voltage Vc, a gate terminal coupled to a gate terminal of the transistor 126 to form a circuit node N1, and a source terminal coupled to a source terminal of the transistor 126 to form a circuit node N2. The transistor 126 has a drain terminal coupled to the drain terminal of the transistor 122. The transistor 126 is in the diode configuration, with the drain terminal that is connected to the gate terminal (and therefore to the circuit node N1).

The second stage further comprises a (depletion) NMOS transistor 128 having a drain terminal coupled to the terminal providing the charge pump voltage Vp, a source terminal connected to the circuit node N2, and a gate terminal connected to the circuit node NO. The transistor 128 acts as a cascode transistor for avoiding breakdown occurrences in the transistors 124, 126 of the current mirror sub-stage 112.

The transistors 116 to 128 of the second stage are high voltage transistors. By "high voltage transistor" it is herein meant a transistor manufactured in such a way to be capable of sustaining, between pairs of terminals thereof, voltage differences higher than a predetermined voltage, for example depending on the supply voltage Vcc, such as for example voltage differences higher than 4 Volts, e.g., comprised in a range from 4 to 30 Volts.

The linear voltage regulator 100 further comprises a third (output) stage comprising an output NMOS transistor MNout having a drain terminal coupled to a terminal providing the charge pump voltage Vp, a gate terminal connected to the circuit node NO for receiving the control voltage Vc generated by the second stage, and a source terminal coupled to a feedback voltage divider network 150 to define a circuit node N3 (regulation node) to provide a regulated voltage Vr. The regulated voltage Vr depends on the output current Iout generated by the output transistor MNout—which in turn depends on the control voltage Vc generated by the second stage.

The output transistor MNout is a high voltage transistor.

The feedback voltage divider network 150 comprises a selectively variable resistor ladder having a center tap N4 coupled to the positive input terminal of the operational amplifier 105 to provide the feedback voltage Vfb. The feedback voltage Vfb depends on the regulated voltage Vr, the former corresponding to a fraction of the latter.

A compensation capacitor C is coupled between the circuit node N3 and the positive output terminal of the operational amplifier 105, to define a circuit node N5.

The compensation capacitor C is a high voltage capacitor. By "high voltage capacitor" it is herein meant a capacitor manufactured in such a way to be capable of sustaining between its terminals, voltage differences higher than a predetermined voltage, for example depending on the supply voltage Vcc, such as for example voltage differences higher than 4 Volts, e.g., comprised in a range from 4 to 30 Volts.

The regulated voltage Vr generated by the linear voltage regulator 100 is configured to be provided to selected memory cells of the NAND flash memory device during the operation of the latter, for example during programming or erasing or reading operations involving said selected memory cells.

As known to those skilled in the art, the array of memory cells of a NAND flash memory device can be arranged according to a hierarchical structure comprising subsets of memory cells. A so-called memory page is the smallest group of memory cells that can be individually addressed for being read or programmed. Memory cells can be typically erased only per memory blocks, where a memory block comprises a number of memory pages (e.g., 64 memory pages). The array of memory cells can be also subdivided into two or more subsets of memory cells called memory planes, each comprising a number of memory blocks. For example, the array of memory cells can be subdivided in a first memory plane comprising odd memory blocks and in a second memory plane comprising even memory blocks. In order to increase the flexibility of the NAND flash memory device operation, each memory plane can be selectively accessed individually or concurrently.

Each memory plane can be associated with a respective voltage regulator, configured to provide a corresponding regulated voltage to the memory cells of the respective memory plane.

FIG. 2 illustrates in a schematic way a portion of a NAND flash memory device comprising a first memory plane of memory cells, identified with reference MP(1), and a second memory plane of memory cells, identified with reference MP(2).

A first linear voltage regulator 200(1)—for example having the same circuit arrangement of the linear voltage regulator 100 of FIG. 1—is configured to generate a regulated voltage Vr(1) to be provided to the memory cells of the first memory plane MP(1). Similarly, a second linear voltage regulator 200(2)—for example having the same circuit arrangement of the linear voltage regulator 100 of FIG. 1—is configured to generate a regulated voltage Vr(2) to be provided to the memory cells of the second memory plane MP(2).

Both the first and the second linear voltage regulators 200(1), 200(2) may be configured to generate the regulated voltages Vr(1), Vr(2), respectively, from a charge pump voltage Vp generated by a charge pump, identified in the figure with reference 210.

In order to minimize current consumption, it is known to arrange the NAND flash memory so that a single linear voltage regulator can also be selectively used to concurrently provide its regulated voltage to more than one memory plane by means of switches.

In the case illustrated in FIG. 2, the output of the first linear voltage regulator 200(1) is directly coupled to the first memory plane MP(1), the output of the second linear voltage regulator 200(2) is coupled to the second memory plane MP(2) through a corresponding switch SWa, and the output of the first linear voltage regulator 200(1) can also be selectively coupled to the second memory plane MP(2) through a corresponding switch SWb.

In a first operative configuration in which the switch SWa is activated (i.e., closed) and the switch SWb is deactivated (i.e., open), the first memory plane MP(1) is provided with the regulated voltage Vr(1) generated by the first linear voltage regulator 200(1), and the second memory plane MP(2) is provided with the regulated voltage Vr(2) generated by the second linear voltage regulator 200(2).

In a second operative configuration in which the switch SWa is deactivated (i.e., open) and the switch SWb is activated (i.e., closed), both the first and second memory planes MP(1), MP(2) are provided with the regulated voltage Vr(1) generated by the first linear voltage regulator 200(1).

SUMMARY OF THE INVENTION

A configuration like the one illustrated in FIG. 2 is not efficient because it implies a large waste of semiconductor area.

Particularly, when both the two linear voltage regulators 200(1) and 200(2) of FIG. 2 are of the type illustrated in FIG. 1, the elements of each linear voltage regulator that mainly contribute to the area occupation on the silicon wafer integrating the linear voltage regulator are the output transistor MNout and the compensation capacitor C. Indeed, the conductivity, and therefore the area occupation, Xmn, of the output transistor MNout (Xmn=Wmn×Lmn, where Wmn is the gate width and Lmn is the gate length of the output transistor MNout) should be sufficiently large to allow the output transistor MNout to deliver an output current Iout (see FIG. 1) having a value suitable for large loads. Moreover, the area occupation Xc of the compensation capacitor C, which is proportional to the capacitance C of the latter, should be large enough to stabilize the feedback loop of the linear voltage regulator during its operation.

Furthermore, to be capable to concurrently drive the first and second memory planes MP(1), MP(2), with the configuration of FIG. 2, the first linear voltage regulator 200(1) has to be designed with:
- an output transistor MNout having an area occupation Xmn that is twice the optimal area occupation Xmn required for driving only the first memory plane MP(1), and
- a compensation capacitor C having an area occupation Xc that is twice the optimal area occupation Xc required for stabilizing the feedback loop when driving only the first memory plane MP(1).

Moreover, in order to ensure a same driving capability in both the two linear voltage regulators 200(1) and 200(2) of FIG. 2, the area occupations Xmn and Xc of the output transistor MNout and of the compensation capacitor C of the second linear voltage regulator 200(2) have to be doubled (as for the first linear voltage regulator 200(1)).

This means that according to FIG. 2, the flexibility given by the possibility of driving two memory planes MP(1), MP(2) with a single linear voltage regulator 200(1) is obtained by an excessive increase in the overall area occupation.

In view of the above, various embodiments of the present invention allow a single linear voltage regulator to selectively provide its regulated voltage to more than one memory plane which requires a reduced silicon area occupation.

An aspect of the present invention relates to a non-volatile semiconductor memory device.

The non-volatile semiconductor memory device comprises a plurality of memory cells comprising at least a first subset of memory cells and a second subset of memory cells.

The non-volatile semiconductor memory device further comprises a first linear voltage regulator comprising a first compensation capacitor.

The first linear voltage regulator is configured to generate at a first regulation node a first regulated voltage from an input voltage.

The first regulation node is connected to the first subset of memory cells to provide the first regulated voltage to the first subset of memory cells.

The non-volatile semiconductor memory device further comprises a second linear voltage regulator comprising a second compensation capacitor.

The second linear voltage regulator is configured to generate at a second regulation node a second regulated voltage from the input voltage.

The non-volatile semiconductor memory device further comprises a first switch selectively activable for coupling the second regulation node to the second subset of memory cells to provide the second regulated voltage to the second subset of memory cells.

The non-volatile semiconductor memory device further comprises a second switch selectively activable for coupling the first regulation node to the second subset of memory cells to provide the first regulated voltage also to the second subset of memory cells.

The non-volatile semiconductor memory device further comprises capacitor coupling switches selectively operable for coupling the second compensation capacitor in parallel to the first compensation capacitor when the first switch is deactivated, and the second switch is activated.

In this way, when the first linear voltage regulator is operating by providing the first regulated voltage to both the first and second subset of memory cells, the feedback loop of the first linear voltage regulator is compensated with an overall capacitance given by the capacitance of the first compensation capacitor plus the capacitance of the second compensation capacitor.

Since the first compensation capacitor of the second linear voltage regulator is exploited by the first linear voltage regulator when the second linear voltage regulator is not used, first and second compensation capacitors having a reduced occupation area can be advantageously used.

According to an embodiment of the present invention, the non-volatile semiconductor memory device is a NAND flash memory device.

According to an embodiment of the present invention, the first subset of memory cells is a first memory plane of the NAND flash memory device, and the second subset of memory cells is a second memory plane of the NAND flash memory device.

According to an embodiment of the present invention, the first linear voltage regulator comprises a first input stage configured to generate at a first amplifier node a first amplifier voltage according to a first reference voltage and a first feedback voltage.

According to an embodiment of the present invention, the first feedback voltage depends on the first regulated voltage at the first regulation node.

According to an embodiment of the present invention, the second linear voltage regulator comprises a second input stage configured to generate at a second amplifier node a second amplifier voltage according to a second reference voltage and a second feedback voltage.

According to an embodiment of the present invention, the second feedback voltage depends on the second regulated voltage at the second regulation node.

According to an embodiment of the present invention, the first compensation capacitor has a first terminal coupled to the first amplifier node and a second terminal coupled to the first regulation node.

According to an embodiment of the present invention, the second compensation capacitor has a first terminal selectively couplable to the second amplifier node and a second terminal selectively couplable to the second regulation node.

According to an embodiment of the present invention, the second terminal of the second compensation capacitor is selectively couplable to the second regulation node by means of the first switch.

According to an embodiment of the present invention, the capacitor coupling switches comprise a first capacitor coupling switch configured to selectively couple the second amplifier node with the first terminal of the second compensation capacitor when activated.

According to an embodiment of the present invention, the capacitor coupling switches comprise a second capacitor coupling switch configured to selectively couple the first terminal of the second compensation capacitor to the first terminal of the first compensation capacitor when activated.

According to an embodiment of the present invention, the first and second capacitor coupling switches are configured so that:
  the first capacitor coupling switch is deactivated, thereby decoupling the second amplifier node from the first terminal of the second compensation capacitor, and the second capacitor coupling switch is activated, thereby coupling the first terminal of the second compensation capacitor to the first terminal of the first compensation capacitor, when the first switch is not activated, and the second switch is activated.

In this way, when both the first subset of memory cell and the second subset of memory cells are provided with the first regulated voltage, a parallel connection of the first compensation capacitor with the second compensation capacitor is advantageously used to compensate the feedback loop of the first linear voltage regulator.

According to an embodiment of the present invention, the first linear voltage regulator and the second linear voltage regulator comprise an intermediate stage supplied by the input voltage and configured to generate a first control voltage and a second control voltage, respectively, based on the first amplifier voltage and on the second amplifier voltage, respectively.

According to an embodiment of the present invention, the first linear voltage regulator comprises a first output transistor having a first conduction terminal coupled to a terminal providing the input voltage, a second conduction terminal coupled to the first regulation node and a control terminal configured to receive the first control voltage.

According to an embodiment of the present invention, the second linear voltage regulator comprises a second output transistor having a first conduction terminal coupled to the terminal providing the input voltage, a second conduction terminal coupled to the second regulation node and a control terminal configured to receive the second control voltage.

According to an embodiment of the present invention, the non-volatile memory device further comprises a third switch selectively activable for coupling the control terminal of the first output transistor to the control terminal of the second output transistor when the first switch is not activated, and the second switch is activated.

In this way, the second output transistor of the second linear voltage regulator can be selectively coupled in parallel to the first output transistor of the first linear voltage regulator when the first linear voltage regulator is used to feed both the first and second subsets of memory cells with the first regulated voltage. Thus, the overall output current delivered toward the first and second subsets of memory cells advantageously comprises the current generated by the first output transistor plus the current generated by the second output transistor.

Since the second output transistor is exploited by the first linear voltage regulator when the second linear voltage regulator is not used, it is possible to use first and second output transistors having a reduced occupation area.

According to an embodiment of the present invention, the second conduction terminal of the second output transistor is coupled to the second regulation node through the first switch.

According to an embodiment of the present invention, the intermediate stage of the first linear voltage regulator further comprises a first input substage configured to receive the first amplifier voltage and a first current mirror substage coupled to the first input substage for generating the first control voltage.

According to an embodiment of the present invention, the first current mirror substage is further coupled to the control terminal of the first output transistor for providing the first control voltage.

According to an embodiment of the present invention, the intermediate stage of the second linear voltage regulator further comprises a second input substage configured to receive the second amplifier voltage and a second current mirror substage selectively couplable to the second input substage for generating the second control voltage.

According to an embodiment of the present invention, the second current mirror substage is further coupled to the control terminal of the second output transistor for providing the second control voltage.

According to an embodiment of the present invention, the non-volatile memory device comprises current mirror coupling switches selectively operable for coupling the second current mirror substage in parallel to the first current mirror substage when the first switch is not activated, and the second switch is activated.

In this way, when the first regulated voltage is provided to both the first and second memory planes, the control terminal of the second output transistor is advantageously charged exploiting the current generated by the second current mirror substage, thus reducing the delay with which the second control voltage increases with respect to the first control voltage when the second output transistor is connected in parallel to the first output transistor through the third switch.

According to an embodiment of the present invention, the non-volatile memory device comprises decoupling switches selectively operable for decoupling the second current mirror substage from the second input substage when the first switch is not activated, and the second switch is activated.

According to an embodiment of the present invention, the first and second switches comprise high voltage transistors capable of sustaining between pairs of terminals thereof voltage differences in a range from 4 to 30 Volts.

According to an embodiment of the present invention, the first capacitor coupling switch and said second capacitor coupling switch comprise low voltage transistors capable of sustaining between pairs of terminals thereof voltage differences lower than 4

Volts.

According to an embodiment of the present invention, the current mirror coupling switches and the decoupling switches comprise low voltage transistors capable of sustaining between pairs of terminals thereof voltage differences lower than 4 Volts.

Another aspect of the present invention relates to a circuit including a first regulator, a second regulator, a first switching circuit and a second switching circuit. The first regulator is configured to output a first output voltage at a first output node. In addition, the first regulator includes a first input stage configured to generate, at a first internal node, a first internal voltage according to a first reference voltage and a first feedback voltage that depends on the first output voltage; and a first capacitor coupled between the first internal node and the first output node. The second regulator is configured to output a second output voltage at a second output node. In addition, the second regulator includes a second input stage configured to generate, at a second internal node, a second internal voltage according to a second reference voltage and a second feedback voltage that depends on the second output voltage; and a second capacitor having one end coupled to a common node of a device. The first switching circuit is configured to couple the second output node to the common node while decoupling the first output node from the common node in a first mode, and decouple the second output node from the common node while coupling the first output node to the common node in a second mode. The second switching circuit is configured to couple the second internal node to the other end of the second capacitor while decoupling the first internal node from the other end in the first mode, and decouple the second internal node from the other end while coupling the first internal node to the other end in the second mode.

BRIEF DESCRIPTION OF THE DRAWINGS

These and other features and advantages of the present invention will be made apparent by the following description of various non-limitative embodiments thereof; for a better understanding, the following description should be read with reference to the attached drawings, wherein.

DETAILED DESCRIPTION OF THE EMBODIMENTS

Figure 3:
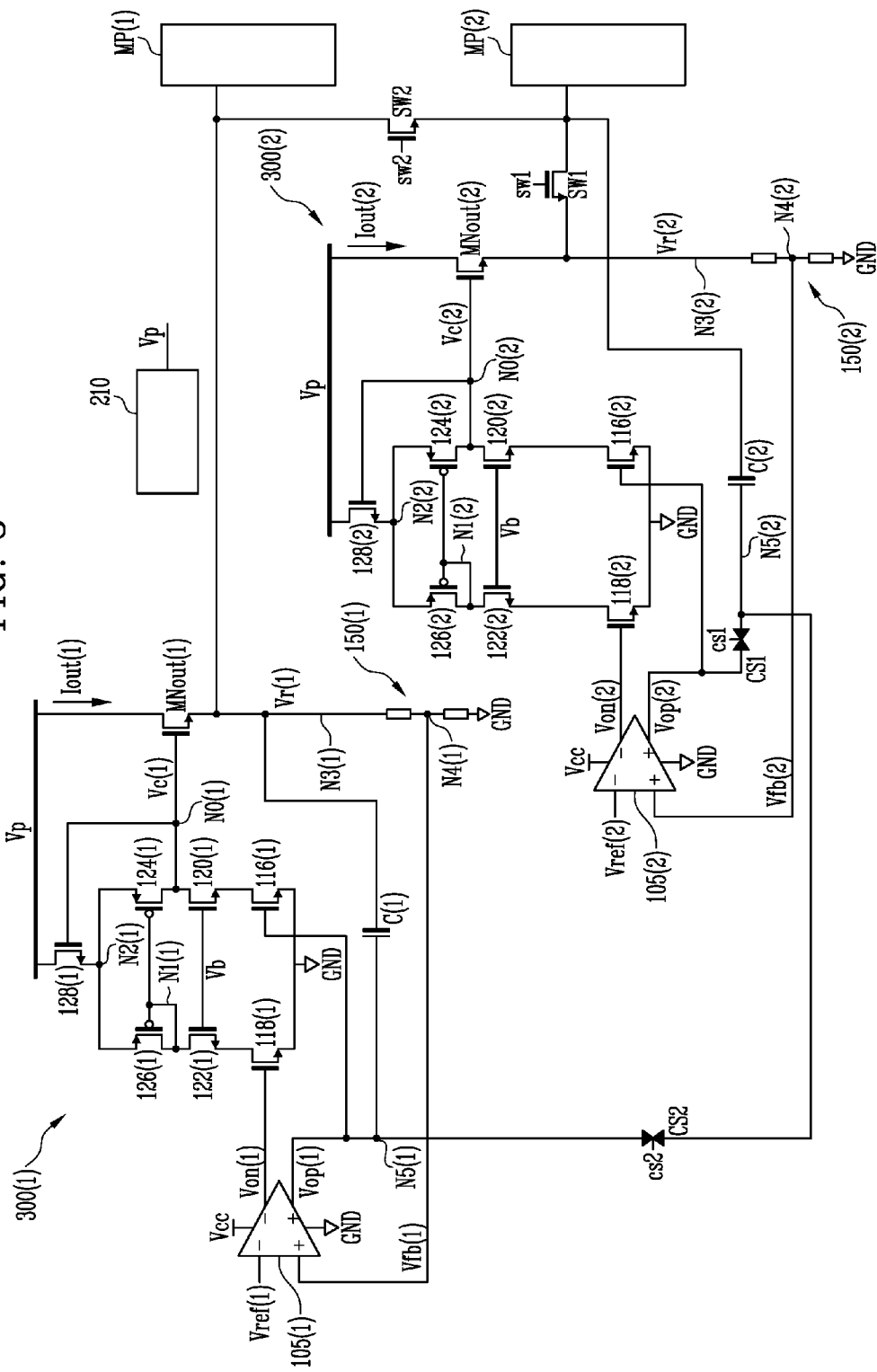
FIG. 3 shows a portion of a NAND flash memory device including a first voltage regulator and a second voltage regulator according to an embodiment of the present invention.

FIG. 3 illustrates a portion of a NAND flash memory device including a first voltage regulator 300(1) and a second voltage regulator 300(2) according to an embodiment of the present invention.

The NAND flash memory device comprises a plurality of memory cells grouped in a first subset of memory cells, or first memory plane, MP(1), and in a second subset of memory cells, or second memory plane, MP(2).

It is pointed out that although in the NAND flash memory device illustrated in FIG. 3 there are two memory planes and two voltage regulators, the concepts of the present invention can be directly applied to cases in which more than two memory planes and/or more than two voltage regulators are provided.

According to an embodiment of the present invention, the first voltage regulator 300(1) is configured to receive from a charge pump 210 a charge pump voltage Vp and accordingly generate a regulated voltage Vr(1). According to an embodiment of the present invention, the second voltage regulator 300(2) is configured to receive from the charge pump 210 the charge pump voltage Vp and accordingly generate a regulated voltage Vr(2).

It is pointed out that the concepts of the present invention can be also applied in a case in which the voltage regulators 300(1) and 300(2) are configured to receive respective charge pump voltages, which are different from each other, from respective charge pumps.

Figure 1:
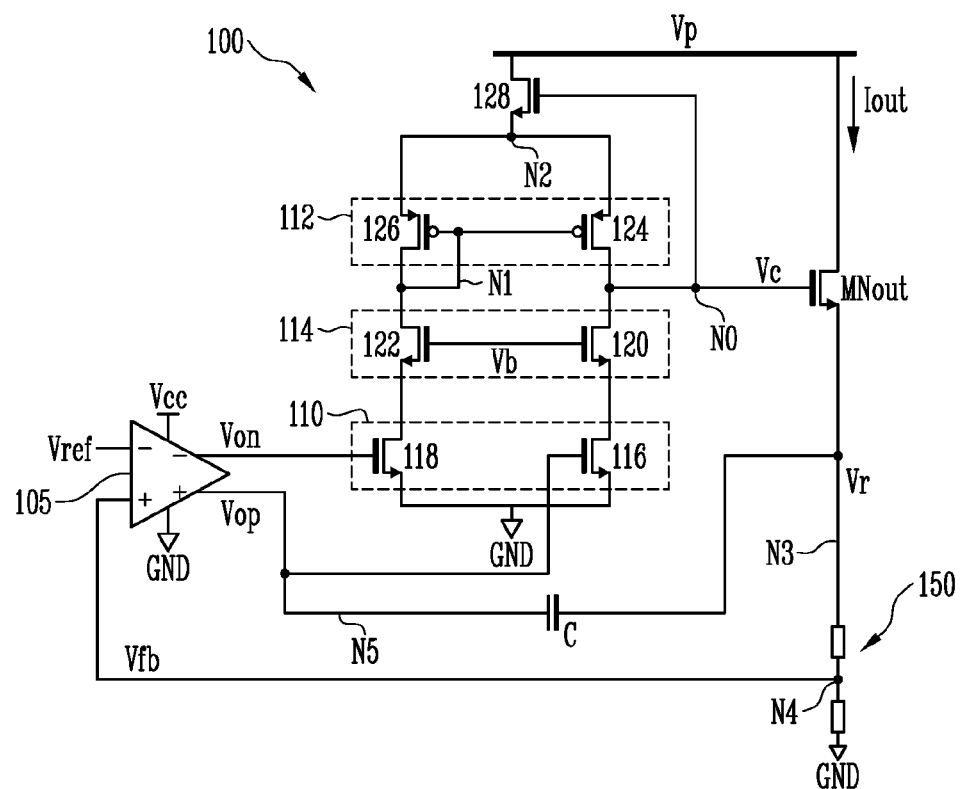
FIG. 1 illustrates a linear voltage regulator.

According to an embodiment of the present invention, the first voltage regulator 300(1) and the second voltage regulator 300(2) are linear voltage regulators like the linear voltage regulator 100 already described with reference to FIG. 1. Elements of the first voltage regulator 300(1), and elements of the second voltage regulator 300(2), respectively, which correspond to elements of the linear voltage regulator 100 will be identified using the same references used in FIG. 1—with the addition of "(1)" for the elements of the first voltage regulator 300(1) (e.g., the operational amplifier 105(1)) and with the addition of "(2)" for the elements of the second voltage regulator 300(2) (e.g., the operational amplifier 105(2))—and the descriptions thereof will be omitted for the sake of conciseness.

According to an embodiment of the present invention, the regulation node N3(1) of the first voltage regulator 300(1) providing the regulated voltage Vr(1) is directly connected to the first memory plane MP(1).

According to an embodiment of the present invention, the regulation node N3(2) of the second voltage regulator 300(2) providing the regulated voltage Vr(2) is selectively couplable to the second memory plane MP(2) through a corresponding selectively activable switch SW1. According to an embodiment of the present invention, the switch SW1 is controlled by a corresponding control signal sw1 to be switched between:

an activated (closed) state, for causing the regulation node N3(2) of the second voltage regulator 300(2) to be electrically connected to the second memory plane MP(2), to provide the regulated voltage Vr(2) to the second memory plane MP(2), and a deactivated (open) state, for causing the regulation node N3(2) of the second voltage regulator 300(2) to be decoupled from the second memory plane MP(2), to prevent the provision of the regulated voltage Vr(2) to the second memory plane MP(2).

According to an embodiment of the present invention, the switch SW1 is a high voltage switch.

According to an embodiment of the present invention, the switch SW1 comprises a high voltage NMOS transistor having a source terminal connected to the regulation node N3(2) of the second voltage regulator 300(2), a drain terminal connected to the second memory plane MP(2) and a gate terminal receiving the control signal sw1.

It is pointed out that according to the embodiment of the invention illustrated in FIG. 3, while the compensation capacitor C(1) of the first voltage regulator 300(1) is directly coupled to the regulation node N3(1) of the first voltage regulator 300(1) (as in the voltage regulator 100 of FIG. 1), the compensation capacitor C(2) of the second voltage regulator 300(2) is coupled to the regulation node N3(2) of the second voltage regulator 300(2) through the switch SW1.

According to an embodiment of the present invention, the regulation node N3(1) of the first voltage regulator 300(1) providing the regulated voltage Vr(1) is selectively couplable to the second memory plane MP(2) through a corresponding selectively activable switch SW2.

According to an embodiment of the present invention, the switch SW2 is controlled by a corresponding control signal sw2 to be switched between:

an activated (closed) state, for causing the regulation node N3(1) of the first voltage regulator 300(1) to be electrically connected to the second memory plane MP(2), to also provide the regulated voltage Vr(1) (i.e., in addition to the first memory plane MP(1)) to the second memory plane MP(2), and a deactivated (open) state, for causing the regulation node N3(1) of the first voltage regulator 300(1) to be decoupled from the second memory plane MP(2).

According to an embodiment of the present invention, the switch SW2 is a high voltage switch.

According to an embodiment of the present invention, the switch SW2 comprises a high voltage NMOS transistor having a source terminal connected to the second memory plane MP(2), a drain terminal connected to the regulation node N3(1) of the first voltage regulator 300(1), and a gate terminal receiving the control signal sw2.

According to an embodiment of the present invention, the voltage regulators 300(1) and 300(2) can be selectively operated in a first operative configuration and in a second operative configuration, wherein:

in the first operative configuration, the switch SW1 is activated (i.e., closed) and the switch SW2 is deactivated (i.e., open), so that the first memory plane MP(1) is provided with the regulated voltage Vr(1) generated by the first voltage regulator 300(1), and the second memory plane MP(2) is provided with the regulated voltage Vr(2) generated by the second voltage regulator 300(2), and in the second operative configuration, the switch SW1 is deactivated (i.e., open) and the switch SW2 is activated (i.e., closed), so that both the first and second memory planes MP(1), MP(2) are provided with the regulated voltage Vr(1) generated by the first voltage regulator 300(1).

According to an embodiment of the present invention, in the second operative configuration, the second voltage regulator 300(2) is advantageously turned off (for example by interrupting the supply thereof through not illustrated switches) to reduce power consumption.

According to an embodiment of the present invention, the compensation capacitor C(2) of the second voltage regulator 300(2) is configured to be selectively coupled in parallel to the compensation capacitor C(1) of the first voltage regulator 300(1) when the voltage regulators 300(1) and 300(2) are operated in the second operative configuration, i.e., when the first voltage regulator 300(1) is used to feed both the first and second memory planes MP(1), MP(2) with the regulated voltage Vr(1).

In this way, in the second operative configuration, when the first voltage regulator 300(1) is operating by providing its regulated voltage Vr(1) to both the first and second memory planes MP(1), MP(2), the feedback loop of the first voltage regulator 300(1) is compensated with an overall capacitance given by the capacitance of the compensation capacitor C(1) of the first voltage regulator 300(1) plus the capacitance of the compensation capacitor C(2) of the second voltage regulator 300(2).

Figure 2:
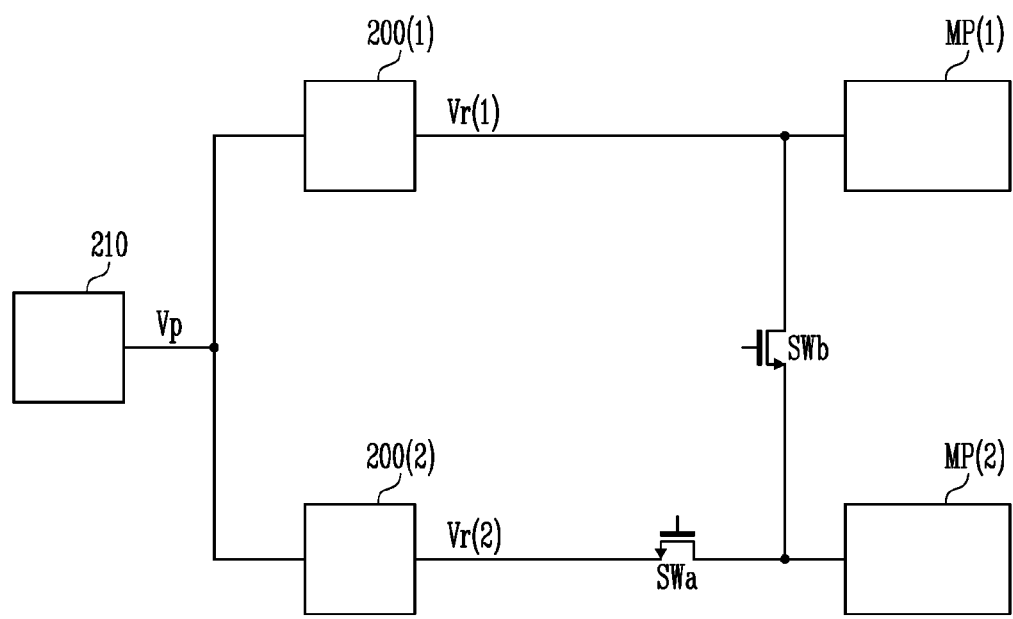
FIG. 2 shows a portion of a NAND flash memory device comprising two memory planes, each one associated with a respective voltage regulator.

Since the compensation capacitor C(2) of the second voltage regulator 300(2) is exploited by the first voltage regulator 300(1) when the second voltage regulator 300(2) is not used, the solution according to the embodiment of the invention of FIG. 3 requires compensation capacitors C(1), C(2) having a reduced (particularly, halved) occupation area Xc compared to the occupation area required by the configuration in FIG. 2.

According to an embodiment of the present invention, the selective coupling of the compensation capacitor C(2) to the compensation capacitor C(1) when the voltage regulators 300(1) and 300(2) are in the second operative configuration is obtained through a capacitor coupling switch arrangement comprising two capacitor coupling switches CS1 and CS2.

According to an embodiment of the present invention, the capacitor coupling switch CS1 has a first conduction terminal coupled to the circuit node N5(2) of the second voltage regulator 300(2) (and therefore to the compensation capacitor C(2)) and a second conduction terminal coupled to the positive output terminal of the operational amplifier 105(2) of the second voltage regulator 300(2).

According to an embodiment of the present invention, the capacitor coupling switch CS2 has a first conduction terminal coupled to the circuit node N5(2) of the second voltage regulator 300(2) (and therefore to the compensation capacitor C(2)) and a second conduction terminal coupled to the circuit node N5(1) of the first voltage regulator 300(1) (and therefore to the compensation capacitor C(1)).

According to an embodiment of the present invention, the capacitor coupling switch CS1 is controlled by a corresponding control signal cs1 to be switched between:

an activated (closed) state, for causing the compensation capacitor C(2) to be electrically coupled to the positive output terminal of the operational amplifier 105(2) of the second voltage regulator 300(2), and a deactivated (open) state, for causing the compensation capacitor C(2) to be electrically decoupled from the positive output terminal of the operational amplifier 105(2) of the second voltage regulator 300(2).

According to an embodiment of the present invention, the capacitor coupling switch CS2 is controlled by a corresponding control signal cs2 to be switched between:

an activated (closed) state, for causing the compensation capacitor C(2) to be coupled with the compensation capacitor C(1), and a deactivated (open) state, for causing the compensation capacitor C(2) to be electrically decoupled from the compensation capacitor C(1).

According to an embodiment of the present invention, when the voltage regulators 300(1) and 300(2) are in the first operative configuration—i.e., when the first memory plane MP(1) is provided with the regulated voltage Vr(1) generated by the first voltage regulator 300(1), and the second memory plane MP(2) is provided with the regulated voltage Vr(2) generated by the second voltage regulator 300(2)—the capacitor coupling switch CS1 is activated (i.e., closed) and the capacitor coupling switch CS2 is deactivated (i.e., open), so that the compensation capacitor C(1) is used to compensate the feedback loop of the first voltage regulator 300(1) and the compensation capacitor C(2) is used to compensate the feedback loop of the second voltage regulator 300(2).

According to an embodiment of the present invention, when the voltage regulators 300(1) and 300(2) are in the second operative configuration—i.e., when both the first memory plane MP(1) and the second memory plane MP(2) are provided with the regulated voltage Vr(1) generated by the first voltage regulator 300(1)—the capacitor coupling switch CS2 is activated (i.e., closed) and the capacitor coupling switch CS1 is deactivated (i.e., open), so that the parallel connection of the compensation capacitor C(1) with the compensation capacitor C(2) is used to compensate the feedback loop of the first voltage regulator 300(1).

According to an embodiment of the present invention, the capacitor coupling switches CS1 and CS2 comprise low voltage transistors.

For example, the capacitor coupling switch CS1 may comprise a transmission gate comprising in turn a low voltage NMOS transistor (not illustrated) controlled by the control signal cs1 and a low voltage PMOS transistor (not illustrated) controlled by a negate version of the control signal cs1. Similarly, the capacitor coupling switch CS2 may comprise a transmission gate comprising in turn a low voltage NMOS transistor (not illustrated) controlled by the control signal cs2 and a low voltage PMOS transistor (not illustrated) controlled by a negate version of the control signal cs2.

Figure 4:
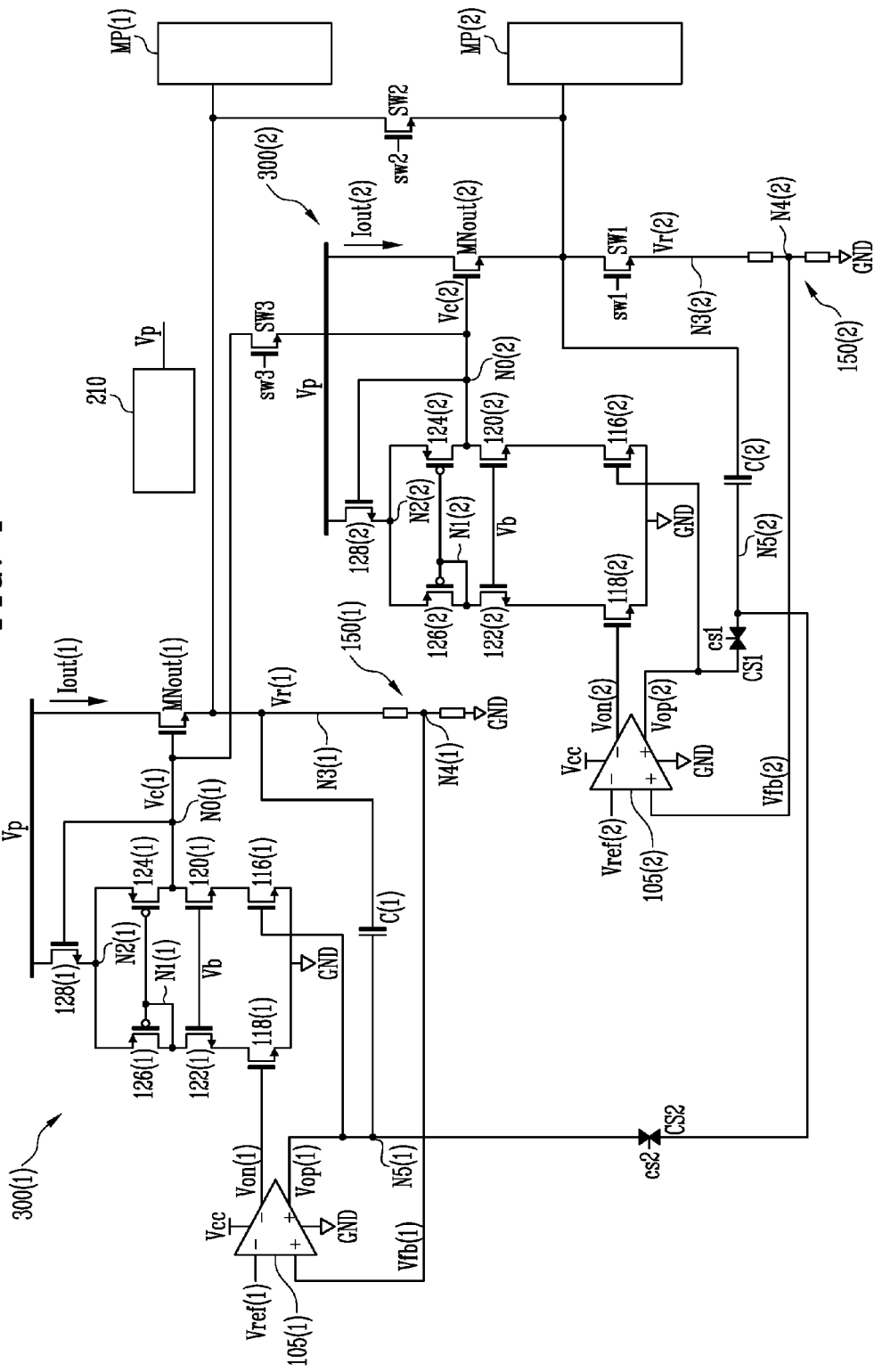
FIG. 4 shows a portion of a NAND flash memory device including a first voltage regulator and a second voltage regulator according to a further embodiment of the present invention.

FIG. 4 illustrates a portion of a NAND flash memory device including the first voltage regulator 300(1) and the second voltage regulator 300(2) according to a further embodiment of the present invention.

Unlike the embodiment of the invention illustrated in FIG. 3, wherein the feedback voltage divider network 150(2) of the second voltage regulator 300(2) is directly coupled to the (source terminal of the) output transistor MNout(2), in the embodiment of the invention illustrated in FIG. 4, the feedback voltage divider network 150(2) of the second voltage regulator 300(2) is coupled to the (source terminal of) the output transistor MNout(2) through the switch SW1.

Moreover, unlike the embodiment of the invention illustrated in FIG. 3, wherein the compensation capacitor C(2) of the second voltage regulator 300(2) is coupled to the (source terminal of the) output transistor MNout(2) of the second voltage regulator 300(2) through the switch SW1, in the embodiment of the invention illustrated in FIG. 4, the compensation capacitor C(2) of the second voltage regulator 300(2) is directly coupled to the (source terminal of the) output transistor MNout(2) of the second voltage regulator 300(2).

According to the embodiment of the invention illustrated in FIG. 4, in addition to having the compensation capacitor C(2) of the second voltage regulator 300(2) configured to be selectively coupled in parallel to the compensation capacitor C(1) of the first voltage regulator 300(1), also the output transistor MNout(2) of the second voltage regulator 300(2) is configured to be selectively coupled in parallel to the output transistor MNout(1) of the first voltage regulator 300(1) when the voltage regulators 300(1) and 300(2) are operated in the second operative configuration, i.e., when the first voltage regulator 300(1) is used to feed both the first and second memory planes MP(1), MP(2) with the regulated voltage Vr(1).

In this way, in the second operative configuration, when the first voltage regulator 300(1) is operating by providing its regulated voltage Vr(1) to both the first and second memory planes MP(1), MP(2), the overall output current delivered toward the first and second memory planes MP(1), MP(2) is generated by the output current Iout(1) generated by the output transistor MNout(1) plus the output current Iout(2) generated by the output transistor MNout(2).

Since the output transistor MNout(2) of the second voltage regulator 300(2) is exploited by the first voltage regulator 300(1) when the second voltage regulator 300(2) is not used, the solution according to the embodiment of the invention of FIG. 4 requires output transistors MNout(1), MNout(2) having a reduced (particularly, halved) occupation area Xmn compared to the occupation area required by the configuration in FIG. 2.

According to an embodiment of the present invention, the selective coupling of the output transistor MNout(1) to the output transistor MNout(2) when the voltage regulators 300(1) and 300(2) are in the second operative configuration is obtained through a selectively activable switch SW3. According to an embodiment of the present invention, the switch SW3 is controlled by a corresponding control signal sw3 to be switched between:

- an activated (closed) state, for causing the circuit node N0(2) (and therefore the gate terminal of the output transistor MNout(2)) of the second voltage regulator 300(2) to be electrically coupled to the circuit node N0(1) (and therefore to the gate terminal of the output transistor MNout(1)) of the first voltage regulator 300(1), and
- a deactivated (open) state, for causing the circuit node N0(2) (and therefore the gate terminal of the output transistor MNout(2)) of the second voltage regulator 300(2) to be electrically decoupled from the circuit node N0(1) (and therefore from the gate terminal of the output transistor MNout(1)) of the first voltage regulator 300(1).

According to an embodiment of the present invention, the switch SW3 is a high voltage switch.

According to an embodiment of the present invention, the switch SW3 comprises a high voltage NMOS transistor having a drain terminal connected to the gate terminal of the output transistor MNout(1) of the first voltage regulator 300(1), a source terminal connected to the gate terminal of the output transistor MNout(2) of the second voltage regulator 300(2), and a gate terminal for receiving the control signal sw3.

According to an embodiment of the present invention, when the voltage regulators 300(1) and 300(2) are in the first operative configuration—i.e., when the first memory plane MP(1) is provided with the regulated voltage Vr(1) generated by the first voltage regulator 300(1), and the second memory plane MP(2) is provided with the regulated voltage Vr(2) generated by the second voltage regulator 300(2)—the switch SW3 is deactivated (i.e., open), so that the output current Iout(1) is delivered to the first memory plane MP(1) and the output current Iout(2) is delivered to the second memory plane MP(2).

According to an embodiment of the present invention, when the voltage regulators 300(1) and 300(2) are in the second operative configuration—i.e., when both the first memory plane MP(1) and the second memory plane MP(2) are provided with the regulated voltage Vr(1) generated by the first voltage regulator 300(1)—the switch SW3 is activated (i.e., closed) so that a current corresponding to Iout(1)+Iout(2) is delivered toward the first and second memory planes MP(1), MP(2).

When the first voltage regulator 300(1) is providing the regulated voltage Vr(1) to both of the two memory planes MP(1), MP(2)—and therefore when the output transistors MNout(1), MNout(2) are coupled to each other through the switch SW3—if the memory planes MP(1), MP(2) suddenly request a large amount of current, the first voltage regulator 300(1) has to react by increasing the control voltages Vc(1), Vc(2) at the circuit nodes N0(1), N0(2) to cause the output transistors MNout(1), MNout(2) to generate the requested large amount of current.

If the switch SW3 coupling the circuit node N0(2) to the circuit node N0(1) is too small, the increase of the control voltage Vc(2) at the circuit node N0(2) is strongly delayed with respect to the increase of the control voltage Vc(1) at the circuit node N0(1). In this unbalanced situation, the majority of the current requested by memory planes MP(1), MP(2) has to be disadvantageously provided by the output transistor MNout(1).

In order to compensate this unbalanced situation, the switch SW3 may be implemented with a wider area to reduce the delay with which the control voltage Vc(2) at the circuit node N0(2) increases with respect to the control voltage Vc(1) at the circuit node N0(1). In this way, the contribution of the output transistor MNout(2) to the generation of the current requested by the output transistors MNout(1), MNout(2) is advantageously increased. However, an increase of the width of the switch SW3 causes a corresponding increase of the parasitic capacitance at the circuit nodes N0(1), N0(2). Since the circuit nodes N0(1), N0(2) are high impedance nodes, such increase of the parasitic capacitance causes in turn a worsening of the frequency response of the voltage regulator 300(1).

Figure 5:
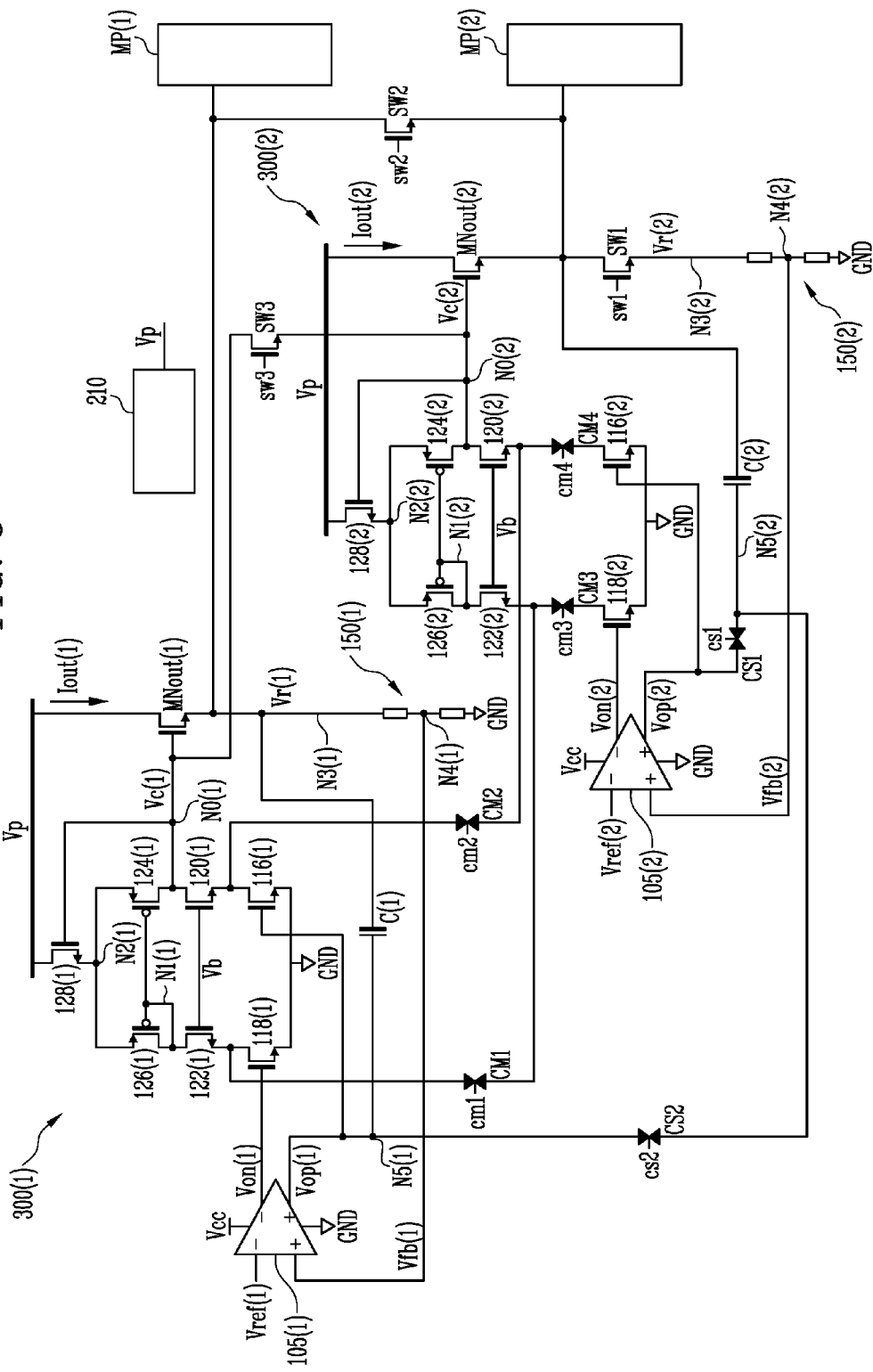
FIG. 5 shows a portion of a NAND flash memory device including a first voltage regulator and a second voltage regulator according to a still further embodiment of the present invention.

FIG. 5 illustrates a portion of a NAND flash memory device including the first voltage regulator 300(1) and the second voltage regulator 300(2) according to a still further embodiment of the present invention.

According to the embodiment of the invention illustrated in FIG. 5, the current mirror substage of the second voltage regulator 300(2) comprising the PMOS transistors 124(2), 126(2) is configured to be selectively coupled in parallel to the current mirror substage of the first voltage regulator 300(1) comprising the PMOS transistors 124(1), 126(1) when the voltage regulators 300(1) and 300(2) are operated in the second operative configuration, i.e., when the first voltage regulator 300(1) is used to feed both the first and second memory planes MP(1), MP(2) with the regulated voltage Vr(1).

In this way, in the second operative configuration, when the first voltage regulator 300(1) is operating by providing its regulated voltage Vr(1) to both the first and second memory planes MP(1), MP(2), the circuit node N0(2) is advantageously charged exploiting (also) the current generated by the PMOS transistors 124(2), 126(2), which are located close to the circuit node N0(2) itself. A reduction is thus obtained in the delay with which the control voltage Vc(2) at the circuit node N0(2) increases with respect to the control voltage Vc(1) at the circuit node N0(1) when the output transistor MNout(2) is connected in parallel to the output transistor MNout(1) through the switch SW3. In this way, the unbalanced situation of FIG. 4, where most of the current provided to the memory planes MP(1) and MP(2) has to be disadvantageously provided by the output transistor MNout(1), is compensated without having to increase the area of the switch SW3.

According to an embodiment of the present invention, the selective coupling of the current mirror substage of the second voltage regulator 300(2), which comprises the PMOS transistors 124(2), 126(2), in parallel to the current mirror substage of the first voltage regulator 300(1), which comprises the PMOS transistors 124(1), 126(1), is obtained through a current mirror coupling arrangement comprising selectively activable current mirror coupling switches CM1 to CM4.

According to an embodiment of the present invention, the current mirror coupling switch CM1 has a first conduction terminal coupled to the source terminal of the NMOS transistor 122(1), and a second conduction terminal coupled to the source terminal of the NMOS transistor 122(2).

According to an embodiment of the present invention, the current mirror coupling switch CM2 has a first conduction terminal coupled to the source terminal of the NMOS transistor 120(1), and a second conduction terminal coupled to the source terminal of the NMOS transistor 120(2).

According to an embodiment of the present invention, the current mirror coupling switch CM3 has a first conduction terminal coupled to the source terminal of the NMOS transistor 122(2) and a second conduction terminal coupled to the drain terminal of the NMOS transistor 118(2).

According to an embodiment of the present invention, the current mirror coupling switch CM4 has a first conduction terminal coupled to the source terminal of the NMOS transistor 120(2) and a second conduction terminal coupled to the drain terminal of the NMOS transistor 116(2).

According to an embodiment of the present invention, the current mirror coupling switch CM1 is controlled by a corresponding control signal cm1 to be switched between:
  an activated (closed) state, for causing the source terminal of the NMOS transistor 122(1) to be electrically coupled to the source terminal of the NMOS transistor 122(2), and
  a deactivated (open) state, for causing the source terminal of the NMOS transistor 122(1) to be electrically decoupled from the source terminal of the NMOS transistor 122(2).

According to an embodiment of the present invention, the current mirror coupling switch CM2 is controlled by a corresponding control signal cm2 to be switched between:
  an activated (closed) state, for causing the source terminal of the NMOS transistor 120(1) to be electrically coupled to the source terminal of the NMOS transistor 120(2), and
  a deactivated (open) state, for causing the source terminal of the NMOS transistor 120(1) to be electrically decoupled from the source terminal of the NMOS transistor 120(2).

According to an embodiment of the present invention, the current mirror coupling switch CM3 is controlled by a corresponding control signal cm3 to be switched between:
  an activated (closed) state, for causing the source terminal of the NMOS transistor 122(2) to be electrically coupled to the drain terminal of the NMOS transistor 118(2), and
  a deactivated (open) state, for causing the source terminal of the NMOS transistor 122(2) to be electrically decoupled from the drain terminal of the NMOS transistor 118(2).

According to an embodiment of the present invention, the current mirror coupling switch CM4 is controlled by a corresponding control signal cm4 to be switched between:
  an activated (closed) state, for causing the source terminal of the NMOS transistor 120(2) to be electrically coupled to the drain terminal of the NMOS transistor 116(2), and
  a deactivated (open) state, for causing the source terminal of the NMOS transistor 120(2) to be electrically decoupled from the drain terminal of the NMOS transistor 116(2).

According to an embodiment of the present invention, when the voltage regulators 300(1) and 300(2) are in the first operative configuration—i.e., when the first memory plane MP(1) is provided with the regulated voltage Vr(1) generated by the first voltage regulator 300(1), the second memory plane MP(2) is provided with the regulated voltage Vr(2) generated by the second voltage regulator 300(2), and the output transistors MNout(1), MNout(2) are not coupled in parallel to each other—the current mirror coupling switches CM1 and CM2 are deactivated (e.g., open) and the current mirror coupling switches CM3 and CM4 are activated (e.g., closed). In this configuration, the PMOS transistors 124(2) and 126(2) of the current mirror substage of the second voltage regulator 300(2) (and the NMOS transistors 120(2) and 122(2)) are electrically coupled to the input substage of the second stage of the second voltage regulator 300(2) comprising the NMOS transistors 116(2), 118(2).

According to an embodiment of the present invention, when the voltage regulators 300(1) and 300(2) are in the second operative configuration—i.e., when both the first memory plane MP(1) and the second memory plane MP(2) are provided with the regulated voltage Vr(1) generated by the first voltage regulator 300(1), and the output transistors MNout(1), MNout(2) are coupled in parallel to each other— the current mirror coupling switches CM1 and CM2 are activated (e.g., closed) and the current mirror coupling switches CM3 and CM4 are deactivated (e.g., open). In this configuration, the PMOS transistors 124(2) and 126(2) of the current mirror substage of the second voltage regulator 300(2) (and the NMOS transistors 120(2) and 122(2)) are electrically decoupled from the input substage of the second stage of the second voltage regulator 300(2) comprising the NMOS transistors 116(2), 118(2) and at the same time are coupled in parallel to the PMOS transistors 124(1) and 126(1) of the current mirror substage of the first voltage regulator 300(1) (and the NMOS transistors 120(1) and 122(1)). In this way, even if the second voltage regulator 300(2) is deactivated, the circuit node N0(2) is advantageously charged exploiting the current generated by the PMOS transistors 124(2), 126(2).

According to an embodiment of the present invention, the current mirror coupling switches CM1 to CM4 comprise low voltage transistors.

For example, each one of the current mirror coupling switches CMi (i=1 to 4) may comprise a respective transmission gate comprising in turn a low voltage NMOS transistor (not illustrated) controlled by the control signal cmi and a low voltage PMOS transistor (not illustrated) controlled by a negate version of the control signal cmi.

It is pointed out that the current mirror coupling switches CMi (i=1 to 4) have been advantageously introduced at low-impedance nodes (i.e., between source and drain terminals of MOS transistors) in order to keep low any delay between the charging of the nodes N0(1) and N02(2).

Naturally, in order to satisfy local and specific requirements, a person skilled in the art may apply to the configuration described above many logical and/or physical modifications and alterations. More specifically, although the present invention has been described with a certain degree of particularity with reference to various embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in other embodiments.

For example, although in the embodiments of the invention illustrated in FIGS. 3 to 5 the voltage regulators 300(1) and 300(2) have been implemented with cascode transistors 128(1), 128(2), respectively, for avoiding breakdown occurrences in the transistors 124(1), 126(1) and 124(2), 126(2), respectively, similar considerations can be applied in case the cascode transistors 128(1), 128(2) are not provided.

Similarly, the concepts of the present invention can be applied also in case the cascode substage comprising the transistors 120(1), 122(1) of the first voltage regulator 300(1) and the cascode substage comprising the transistors 120(2), 122(2) of the second voltage regulator 300(2) are not provided.

While the present teachings have been illustrated and described with respect to the specific embodiments, it will be apparent to those skilled in the art in light of the present disclosure that various changes and modifications may be made without departing from the spirit and scope of the disclosure as defined in the following claims. Furthermore, the embodiments may be combined to form additional embodiments.

What is claimed is:

1. A non-volatile semiconductor memory device comprising:
    a plurality of memory cells comprising at least a first subset of memory cells and a second subset of memory cells;
    a first linear voltage regulator comprising a first compensation capacitor and being configured to generate at a first regulation node a first regulated voltage from an input voltage, the first regulation node being connected to the first subset of memory cells to provide the first regulated voltage to the first subset of memory cells;
    a second linear voltage regulator comprising a second compensation capacitor and being configured to generate at a second regulation node a second regulated voltage from the input voltage;
    a first switch selectively activable for coupling the second regulation node to the second subset of memory cells so as to provide the second regulated voltage to the second subset of memory cells;
    a second switch selectively activable for coupling the first regulation node to the second subset of memory cells to provide the first regulated voltage to the second subset of memory cells; and
    capacitor coupling switches selectively operable for coupling the second compensation capacitor in parallel to the first compensation capacitor when the first switch is deactivated and the second switch is activated.

2. The non-volatile semiconductor memory device of claim 1, wherein:
    the first linear voltage regulator comprises a first input stage configured to generate at a first amplifier node a first amplifier voltage according to a first reference voltage and a first feedback voltage, the first feedback voltage depending on said first regulated voltage at the first regulation node;
    the second linear voltage regulator comprises a second input stage configured to generate at a second amplifier node a second amplifier voltage according to a second reference voltage and a second feedback voltage, the second feedback voltage depending on the second regulated voltage at the second regulation node;
    the first compensation capacitor has a first terminal coupled to the first amplifier node and a second terminal coupled to the first regulation node; and
    the second compensation capacitor has a first terminal selectively couplable to the second amplifier node and a second terminal selectively couplable to the second regulation node.

3. The non-volatile semiconductor memory device of claim 2, wherein the second terminal of the second compensation capacitor is selectively couplable to the second regulation node by means of the first switch.

4. The non-volatile semiconductor memory device of claim 2, wherein said capacitor coupling switches comprise:
    a first capacitor coupling switch configured to selectively couple the second amplifier node with the first terminal of the second compensation capacitor when activated; and
    a second capacitor coupling switch configured to selectively couple the first terminal of the second compensation capacitor to the first terminal of the first compensation capacitor when activated.

5. The non-volatile semiconductor memory device of claim 4, wherein the first capacitor coupling switch and the second capacitor coupling switch are configured so that:
    the first capacitor coupling switch is deactivated, thereby decoupling the second amplifier node from the first terminal of the second compensation capacitor, and the second capacitor coupling switch is activated, thereby coupling the first terminal of the second compensation capacitor to the first terminal of the first compensation capacitor, when the first switch is not activated and the second switch is activated.

6. The non-volatile semiconductor memory device of claim 4, wherein the first capacitor coupling switch and the second capacitor coupling switch comprise low voltage transistors capable of sustaining between pairs of terminals thereof voltage differences lower than 4 Volts.

7. The non-volatile semiconductor memory device of claim 2, wherein:

the first linear voltage regulator and the second linear voltage regulator comprise respective intermediate stages supplied by the input voltage and configured to generate a first control voltage and a second control voltage, respectively, based on the first amplifier voltage and on the second amplifier voltage, the first linear voltage regulator comprises a first output transistor having a first conduction terminal coupled to a terminal providing the input voltage, a second conduction terminal coupled to the first regulation node and a control terminal configured to receive the first control voltage, and the second linear voltage regulator comprises a second output transistor having a first conduction terminal coupled to the terminal providing the input voltage, a second conduction terminal coupled to the second regulation node and a control terminal configured to receive the second control voltage.

8. The non-volatile semiconductor memory device of claim 7, further comprising a third switch selectively activable for coupling the control terminal of the first output transistor to the control terminal of the second output transistor when the first switch is not activated and the second switch is activated.

9. The non-volatile semiconductor memory device of claim 7, wherein the second conduction terminal of the second output transistor is coupled to the second regulation node through the first switch.

10. The non-volatile semiconductor memory device of claim 7, wherein:

the intermediate stage of the first linear voltage regulator further comprises a first input substage configured to receive the first amplifier voltage and a first current mirror substage coupled to the first input substage for generating the first control voltage, the first current mirror substage being further coupled to the control terminal of the first output transistor for providing the first control voltage; and the intermediate stage of the second linear voltage regulator further comprises a second input substage configured to receive the second amplifier voltage and a second current mirror substage selectively couplable to the second input substage for generating the second control voltage, the second current mirror substage being further coupled to the control terminal of the second output transistor for providing the second control voltage.

11. The non-volatile semiconductor memory device of claim 10, further comprising current mirror coupling switches selectively operable for coupling the second current mirror substage in parallel to the first current mirror substage when the first switch is not activated and the second switch is activated.

12. The non-volatile semiconductor memory device of claim 11, wherein the current mirror coupling switches and the decoupling switches comprise low voltage transistors capable of sustaining between pairs of terminals thereof voltage differences lower than 4 Volts.

13. The non-volatile semiconductor memory device of claim 12, further comprising decoupling switches selectively operable for decoupling the second current mirror substage from the second input substage when the first switch is not activated and the second switch is activated.

14. The non-volatile semiconductor memory device of claim 1, wherein the first switch and the second switch comprise high voltage transistors capable of sustaining between pairs of terminals thereof voltage differences in a range from 4 to 30 Volts.

15. A circuit comprising:

a first regulator configured to output a first output voltage at a first output node and including:

a first input stage configured to generate, at a first internal node, a first internal voltage according to a first reference voltage and a first feedback voltage that depends on the first output voltage; and a first capacitor coupled between the first internal node and the first output node;

a second regulator configured to output a second output voltage at a second output node and including:

a second input stage configured to generate, at a second internal node, a second internal voltage according to a second reference voltage and a second feedback voltage that depends on the second output voltage; and a second capacitor having one end coupled to a common node of a device;

a first switching circuit configured to:

couple the second output node to the common node while decoupling the first output node from the common node in a first mode, and decouple the second output node from the common node while coupling the first output node to the common node in a second mode; and a second switching circuit configured to:

couple the second internal node to the other end of the second capacitor while decoupling the first internal node from the other end in the first mode, and decouple the second internal node from the other end while coupling the first internal node to the other end in the second mode.

\* \* \* \* \*